US011202227B2

(12) United States Patent
Liu et al.

(10) Patent No.: US 11,202,227 B2
(45) Date of Patent: Dec. 14, 2021

(54) PROCESSING METHOD AND DEVICE FOR CACHE SYNCHRONOUS EXCEPTION

(71) Applicant: China Academy of Telecommunications Technology, Beijing (CN)

(72) Inventors: Jiamin Liu, Beijing (CN); Haiyang Quan, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 52 days.

(21) Appl. No.: 16/764,849

(22) PCT Filed: Oct. 29, 2018

(86) PCT No.: PCT/CN2018/112480
§ 371 (c)(1),
(2) Date: May 16, 2020

(87) PCT Pub. No.: WO2019/095989
PCT Pub. Date: May 23, 2019

(65) Prior Publication Data
US 2020/0344644 A1  Oct. 29, 2020

(30) Foreign Application Priority Data

Nov. 16, 2017 (CN) .......................... 201711140664.8

(51) Int. Cl.
*H04W 28/04* (2009.01)
*H04L 1/18* (2006.01)
(Continued)

(52) U.S. Cl.
CPC ........... *H04W 28/04* (2013.01); *H04L 1/1835* (2013.01); *H04L 1/1874* (2013.01); *H04W 28/06* (2013.01); *H04W 80/02* (2013.01)

(58) Field of Classification Search
CPC . H03M 7/3088; H03M 7/6052; H04W 28/04; H04W 28/06; H04L 69/324; H04L 1/1835; H04L 1/1874
See application file for complete search history.

(56) References Cited

U.S. PATENT DOCUMENTS

| 5,130,993 A | 7/1992 | Gutman et al. |
| 9,442,941 B1 | 9/2016 | Luz et al. |

(Continued)

FOREIGN PATENT DOCUMENTS

| CN | 101605335 A | 12/2009 |
| CN | 103582030 A | 2/2014 |

(Continued)

OTHER PUBLICATIONS

CATT,"Update of Description and Evaluation Results for Deflate", 3GPP TSG-RAN2 Meeting #99, Berlin, Germany, Aug. 21-25, 2017, total 17 pages, R2-1708359.

(Continued)

*Primary Examiner* — Syed Ali
(74) *Attorney, Agent, or Firm* — Kilpatrick Townsend & Stockton, LLP

(57) ABSTRACT

Disclosed in the present disclosure are a processing method and device for a cache synchronous exception, for solving the problem that no solution for a compression check failure is available in the prior art. According to embodiments of the present disclosure, when caches are out of synchronization, a caching failure notification message is sent to a transmitting device; a reset processing is carried out on a compressed cache area, and a reset instruction is sent; and then subsequent data packet transmission is carried out by using reset cache areas. In the present disclosure, after it is determined that the caches are out of synchronization, the caching failure notification message is sent; the transmitting device performs a reset processing on the compressed cache area, (Continued)

and notifies a receiving device to carry out a reset processing on a decompressed cache area.

19 Claims, 7 Drawing Sheets

(51) Int. Cl.
*H04W 28/06* (2009.01)
*H04W 80/02* (2009.01)

(56) References Cited

U.S. PATENT DOCUMENTS

| | | |
|---|---|---|
| 2008/0148136 A1 | 6/2008 | Bae et al. |
| 2015/0085835 A1 | 3/2015 | Eravelli et al. |
| 2018/0234839 A1* | 8/2018 | Tenny .................. H04L 63/061 |
| 2018/0270894 A1* | 9/2018 | Park ...................... H04W 76/27 |
| 2018/0310202 A1* | 10/2018 | Lohr ...................... H04W 76/27 |
| 2019/0045568 A1* | 2/2019 | Palat ...................... H04W 76/18 |
| 2020/0187282 A1* | 6/2020 | Yu .............................. H04L 1/18 |
| 2020/0229111 A1* | 7/2020 | Kim .................... H04W 52/242 |
| 2020/0382431 A1* | 12/2020 | Decarreau ............... H04L 1/188 |
| 2021/0112610 A1* | 4/2021 | Xiao ..................... H04W 28/04 |

FOREIGN PATENT DOCUMENTS

| | | |
|---|---|---|
| CN | 105556924 A | 5/2016 |
| CN | 106302245 A | 1/2017 |
| CN | 107094142 A | 8/2017 |
| CN | 107302585 A | 10/2017 |
| EP | 0507884 A1 | 10/1992 |
| EP | 3665973 A1 | 6/2020 |
| JP | 2010519880 A | 6/2010 |
| JP | 2012521108 A | 9/2012 |
| JP | 2016536935 A | 11/2016 |
| KR | 1020160060670 A | 5/2016 |

OTHER PUBLICATIONS

CATT,"More Details and Simulation Results of Deflate with 1 Byte UDC Header", 3GPP TSG-RAN WG2 #99, Berlin, Germany, Aug. 21-25, 2017, total 7 pages, R2-1708358.
CATT "Introduction of DEFLATE based UDC Solution", 3GPP TSG-RAN2 Meeting #99bis Prague, Czech Republic, Oct. 9-13, 2017 total 10 pages, R2-1712070.
3GPP TR 36.754 V15.1.0; 3rd Generation Partnership Project; Technical Specification Group Radio Access Network Evolved Universal Terrestrial Radio Access (E-UTRA);Study on UL data compression for E-UTRA (Release 15) Sep. 2017; 33 pages.

* cited by examiner

PROCESSING METHOD AND DEVICE FOR CACHE SYNCHRONOUS EXCEPTION

CROSS REFERENCE

This application is a National Stage of International Application No. PCT/CN2018/112480, filed on Oct. 29, 2018, which claims the benefit and priority of Chinese Patent Application No. 201711140664.8 filed with the Chinese Patent Office on Nov. 16, 2017, and entitled "A method and device for handling out-of-sync buffers". The entire content of the disclosure is incorporated herein by reference.

FIELD

The present disclosure relates to the field of communications, and particularly to a method and device for handling out-of-sync buffers.

BACKGROUND

In long term evolution (hereinafter "LIE") or LTE-Advanced (hereinafter "LTE-A"), a user equipment (hereinafter "UE") could be configured with uplink data compression (hereinafter "UDC") function. If UDC is configured, the UE compresses uplink data or signaling at layer 2 and an eNodeB (hereinafter "eNB") de-compresses the compressed data in a corresponding protocol layer, to reduce the amount of data sent on air interface, save uplink resources and improve transmission efficiency.

To achieve higher compression ratio, the UE and the eNB maintain a compression buffer and a decompression buffer according to transmitted and received data, respectively and independently of each other. Generally, two kinds of contents may be put into the compression buffer and the decompression buffer. One kind of contents are pre-configured contents which are highly likely to match between consecutive data packets, e.g., hyper txt transport protocol (hereinafter "HTTP") headers such as Host: and Accept:. The other kind of contents are contents of previously transmitted or received data packets. E.g., when data packets are transmitted continuously, past data packets may be put into the buffers and the content of a current data packet may be matched to the past data packets.

However, when uplink data transmission or the radio link fails, a checksum error might be detected due to mismatch between the compression and de-compression buffers, leading to unsuccessful decompression, by the eNB, of subsequent data packets compressed by the UE. In the existing technology, the UDC technology is only partly standardized, and there's no solution for handling checksum errors.

In summary, there's no existing solution for handling checksum errors.

SUMMARY

Embodiments of the disclosure provide a method and a device for handling out-of-sync buffers, to provide a solution for handling checksum errors.

An embodiment of the disclosure provides a method for handling out-of-sync buffers. The method includes: notifying, by a receiving device, a transmitting device after determining that a compression buffer and a decompression buffer are out of sync; resetting, by the receiving device, the decompression buffer after receiving a reset instruction from the transmitting device; and decompressing, by the receiving device, a received UDC data packet with help of the reset decompression buffer.

The embodiment of the disclosure also provides another method for handling out-of-sync buffers. The method includes: resetting, by a transmitting device, a compression buffer and transmitting a reset instruction to a receiving device after being notified by the receiving device that the compression buffer and a decompression buffer are out of sync; and transmitting, by the transmitting device, to the receiving device a UDC data packet compressed with help of the reset compression buffer.

The embodiment of the disclosure further provides a receiving device for handling out-of-sync buffers. The receiving device includes a processor, a memory and a transceiver. The processor is configured to read a program in the memory to: notify a transmitting device after determining that a compression buffer and a decompression buffer are out of sync; reset the decompression buffer after receiving a reset instruction from the transmitting device; and decompress a received UDC data packet with help of the reset decompression buffer.

The embodiment of the disclosure also provides a transmitting device for handling out-of-sync buffers. The transmitting device includes a processor, a memory and a transceiver. The processor is configured to read a program in the memory to: reset a compression buffer and transmit a reset instruction to a receiving device after being notified by the receiving device that the compression buffer and a decompression buffer are out of sync; and transmit to the receiving device a UDC data packet compressed with help of the reset compression buffer.

The embodiment of the disclosure also provides another receiving device for handling out-of-sync buffers. The receiving device includes a first transmit device, a first reset device, and a first execute device. The first transmit device is configured to notify a transmitting device after determining that a compression buffer and a decompression buffer are out of sync. The first reset device is configured to reset the decompression buffer after receiving a reset instruction from the transmitting device. The first execute device is configured to decompress a received UDC data packet with help of the reset decompression buffer.

The embodiment of the disclosure further provides another transmitting device for handling out-of-sync buffers. The transmitting device includes a second reset device and a second transmit device. The second reset device is configured to reset a compression buffer and transmit a reset instruction to a receiving device after being notified by the receiving device that the compression buffer and a decompression buffer are out of sync. The second transmit device is configured to transmit the receiving device a UDC data packet compressed with help of the reset compression buffer.

The embodiment of the disclosure also provides a storage medium readable to a device for handling out-of-sync buffers. The storage medium includes program codes. When the program codes are run by a computing device, the computing device performs the method performed by the receiving device or performed by the transmitting device.

According to the embodiment of the disclosure, after determining that a compression buffer and a decompression buffer are out of sync, a receiving device transmits a mismatch notification to the transmitting device; the transmitting device resets the compression buffer and sends a reset instruction to the receiving device; the receiving device resets the decompression buffer after receiving the reset instruction from the transmitting device; and the transmitting device and the receiving device perform subsequent data packet transmission with the help of reset compression and decompression buffers. In other words, if the compression and decompression buffers are determined to be out of sync, the receiving device shall send a mismatch notification to the transmitting device, the transmitting device would learn about the checksum error, reset the compression buffer and instructing the receiving device to reset the decompression buffer. After the reset is done, the transmitting and receiving devices perform subsequent data packet transmission with the help of reset compression and decompression buffers. As such, not only the existing problem of checksum error is solved, the UDC function is taken full advantage of, air-interface resources are saved and transmission efficiency is improved.

BRIEF DESCRIPTION OF THE DRAWINGS

To describe the embodiment of the disclosure more clearly, drawings illustrating the embodiment of the disclosure are briefly introduced below. Apparently, the drawings introduced below illustrate only a part of implementations of the embodiment of the disclosure.

DETAILED DESCRIPTION OF THE EMBODIMENTS

Figure 1:
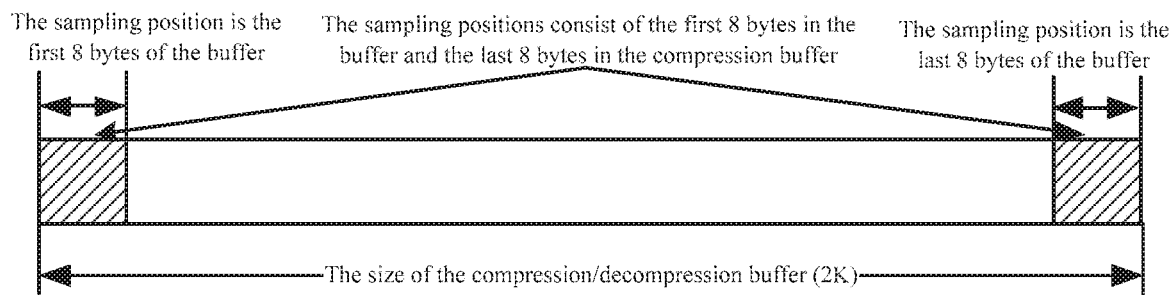
FIG. 1 is a schematic diagram of determining sampling position(s) according to preset fixed position information according to an embodiment of the disclosure.

Some terms herein are explained below to facilitate understanding.

1. The words "network" and "system" are interchangeable herein.

2. The expression "a plurality of" herein refers to two or more than two.

3. The expression "and/or" refers to three kinds of relationships. For example, A and/or B represents the three situations that only A exists, both A and B exist, and only B exists. The symbol "/" represents a "or" relationship.

The embodiment of the disclosure will be described below clearly and fully with reference to the accompanying drawings. Apparently the implementations to be described below are only a part but not all of the implementations of the embodiment of the disclosure. Based upon the implementations of the embodiment of the disclosure described herein.

To implement the UDC, a transmitting device needs to maintain a compression buffer and a receiving device needs to maintain a decompression buffer. The buffers of the receiver and transmitting devices store un-compressed data packets. Before sending data, the transmitting device compares the data to be sent and data in the compression buffer, and transmits the data in the compression buffer, which replaces the original data to be sent, to the receiving device when the original data to be sent and the data in the compression buffer are the same.

Correspondingly, the receiving device decompresses the data sent by the transmitting device, using the data in the decompression buffer as a reference point. To ensure that the receiving device can successfully decompress the received data packet, contents of the two buffers should be the same, i.e., the buffers of the receiving and transmitting devices are in sync.

To check if the buffers of the receive and transmitting devices are in sync, when transmitting a data packet, the transmitting device would extract some data from the ilk compression buffer using a preset sampling method, generate a checksum using the extracted data, put the checksum into the data packet and send the data packet to the receiving device.

Correspondingly, after receiving the data packet sent by the transmitting device, the receiving device would extract the checksum generated by the transmitting device from the data packet, extract some data from the decompression buffer using a preset sampling method, generate another checksum by using the extracted data and compare the checksum generated by itself and the checksum generated by the transmit data. If the two checksums are equal, it means that the buffers of the transmitting and receiving devices are in sync. If the two checksums are different, it means that the buffers of the transmitting and receiving devices are out of sync.

It is to be noted that the preset sampling methods and the methods for generating the checksums should be the same for the transmitting and receiving devices. For example, when the transmitting device determines sampling position(s) for sampling a part of data from the compression buffer according to preset fixed position information, the receiving device should also sample a part of data from the decompression buffer according to the preset fixed position information.

There are two ways of sampling a part of the data from the compression buffer of the transmitting device or from the decompression buffer of the receiving devices. One way is to a part of the data from the buffer according to preset fixed position information and the other way is to sample a part of the data from the buffer according to preset pattern position information. The two different ways are described below in detail.

1. Sampling a part of the data from the buffer according to preset fixed position information.

In practice, the fixed position information may be determined according to a standard or may be configured by the network side.

The fixed position information may indicate one of the three kinds of information below.

(1) The sampling position consists of the first M bytes in the buffer.

For example, as illustrated by FIG. 1, when the size of the buffer is set to be 2 kilobytes, the sampling position consists of the first 8 bytes of the buffer and data is extracted from the 8 bytes.

(2) The sampling position consists of the last N bytes in the buffer.

For example, as illustrated by FIG. 1, when the size of the buffer is set to be 2 kilobytes, the sampling position consists of the last 8 bytes of the buffer and data is extracted from the 8 bytes.

(3) The sampling positions consist of the first M bytes and the last N bytes in the ifs buffer.

For example, as illustrated by FIG. 1, when the size of the buffer is set to be 2 kilobytes, the first 8 bytes in the head of the buffer and the 16 bytes in the tail of the buffer consist the sampling positions and data is extracted from the 24 bytes.

2. Determining the sampling position(s) according to preset pattern position information to generate a checksum.

The pattern position information may be determined by a standard, or may be configured by the network side.

In one embodiment, the pattern position information includes but is not limited to a part or all of: the number of bytes included by each sampling cycle (i.e. how many bytes are included in the each sampling cycle), the number of sampled bytes per sampling cycle (i.e. how many bytes are collected in the each sampling cycle), the sampling start positions of each sampling cycle (i.e., the position where sampling starts in a sampling cycle), the number of bytes per sampling interval (i.e., the number of bytes between two adjacent sampling positions), the number of sampling intervals, the number of bytes sampled between two adjacent sampling intervals, and a sampling direction (i.e., from the head to the tail or from the tail to the head).

Examples of determining the sampling position(s) according to the preset pattern position information are described below.

1. When the pattern position information includes the number of sampling intervals, the number of bytes sampled between two adjacent sampling intervals and the sampling direction, the two methods below may be used for determining the sampling position(s).

(1) The sampling direction is from a head of a buffer to a tail of the buffer.

Figure 2:
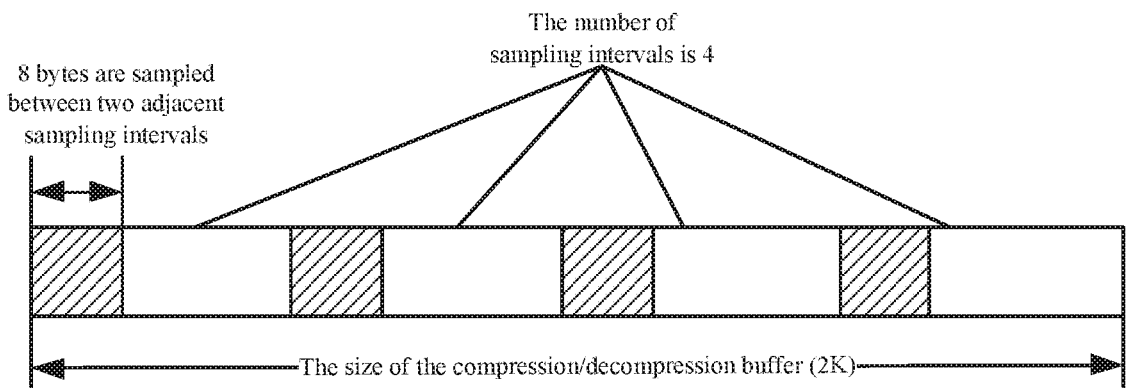
FIG. 2 is a schematic diagram of determining sampling positions according to the number of sampling intervals and the number of bytes sampled between two adjacent sampling intervals when the sampling direction is to sample from a head of a buffer to a tail of the buffer according to an embodiment of the disclosure.

As illustrated by FIG. 2, suppose that the size of the buffer is set to be 2 kilobytes (2048 bytes), the number of sampling intervals is 4, and 8 bytes are sampled between two adjacent sampling intervals, then the 2048 bytes may be divided into 4 parts having equivalent lengths, and the first 8 bytes of each part may be used as the sampling positions.

(2) The sampling direction is from the tail of the buffer to the head of the buffer.

Figure 3:
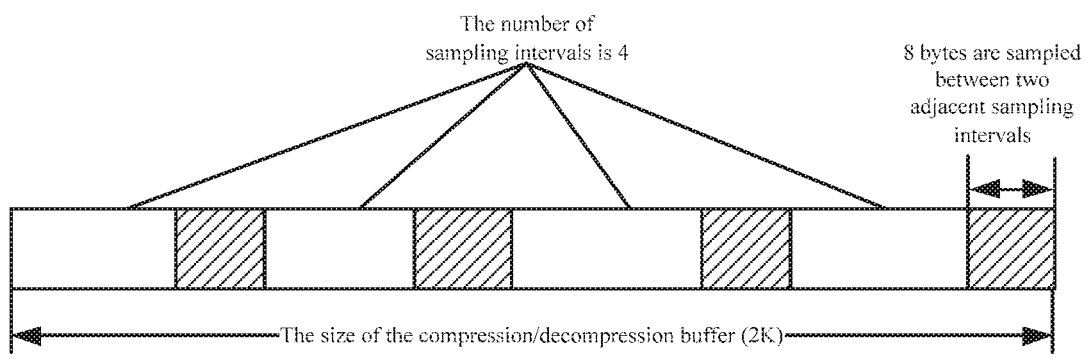
FIG. 3 is a schematic diagram of determining sampling positions according to the number of sampling intervals and the number of bytes sampled between two adjacent sampling intervals when the sampling direction is to sample from a tail of a buffer to a head of a buffer according to an embodiment of the disclosure.

As illustrated by FIG. 3, suppose that the size of the buffer is set to be 2 kilobytes (2048 bytes), the number of sampling intervals is 4, and 8 bytes are sampled between two adjacent sampling intervals, then the 2048 bytes may be divided into 4 parts having equivalent lengths, and the last 8 bytes of each part may be used as the sampling positions.

2. When the pattern position information includes the number of sampling intervals and the number of bytes sampled between two adjacent sampling intervals, the sampling positions may be determined by taking the first X bytes and the last X bytes in the buffer as two of the sampling positions, and then determining the rest of the sampling positions between the first X bytes and the last X bytes in the buffer according to the number of sampling intervals and the number of bytes sampled between two adjacent intervals. X represents the number of bytes sampled between two adjacent intervals.

Figure 4:
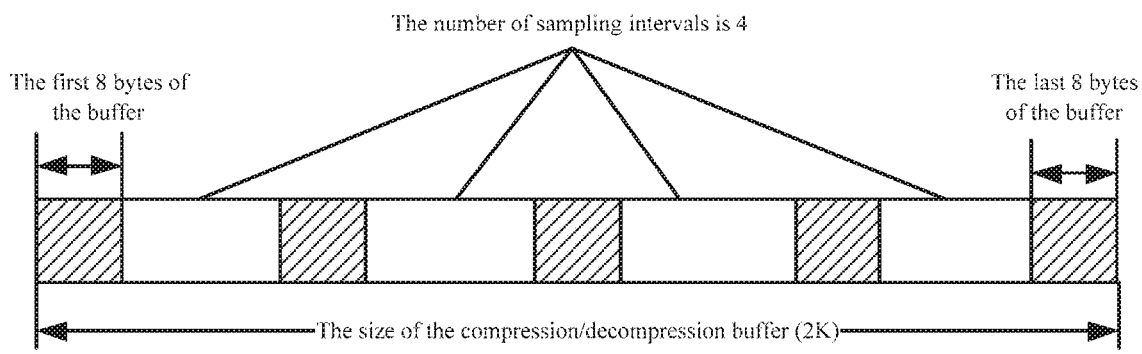
FIG. 4 is a schematic diagram of determining sampling positions as first X bytes and last X bytes in a buffer according to the number of sampling intervals and the number of bytes sampled between two adjacent sampling intervals according to an embodiment of the disclosure.

As illustrated by FIG. 4, suppose that the size of the buffer is set to be 2 kilobytes (2048 bytes), the number of sampling intervals is 4, and the first 8 bytes, [1, 8], and the last 8 bytes, [2041, 2048], of the buffer are determined as two of the sampling positions, then the reset of the sampling positions are determined from the rest 2032 bytes, [9, 2040] according to the number of sampling intervals.

3. When the pattern position information includes the number of bytes included by each sampling cycle, the number of sampled bytes per sampling cycle and the sampling start positions of each sampling cycle, the sampling positions are determined as follows.

Figure 5:
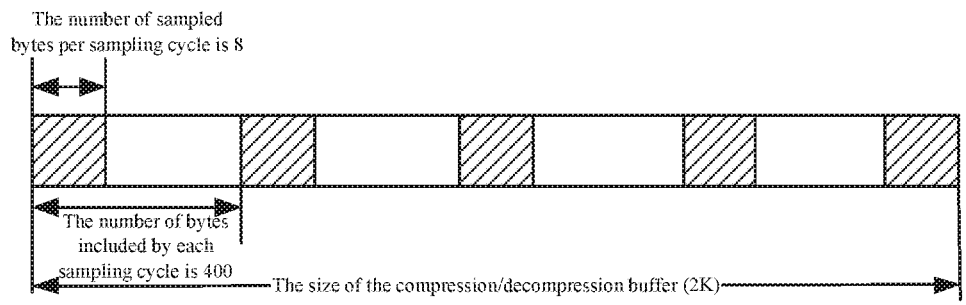
FIG. 5 is a schematic diagram of determining sampling positions according to the number of bytes included by each sampling cycle, the number of sampled bytes per sampling cycle and sampling start positions of each sampling cycle according to an embodiment of the disclosure.

As illustrated by FIG. 5, suppose that the size of the buffer is set to be 2 kilobytes (2048 bytes), and the number of bytes included by each sampling cycle is 400, the number of sampled bytes per sampling cycle is 8, and the sampling start positions of each sampling cycle are the first bytes of each sampling cycle. First of all, the bytes [1, 400] in the buffer are determined as a sampling cycle, where the bytes [1, 8] of the first 400 bytes are determined as one of the sampling positions, and data of the bytes [9, 400] are determined as other data. Then the bytes [401, 800] in the buffer are determined as another sampling cycle, where the bytes [401, 408] are determined as another sampling data and data of the bytes [409, 800] are determined as other data. The process is repeated till the end of the buffer.

Accordingly, the sampling start position of a sampling cycle may be the last byte of the sampling cycle instead, or any other position in the sampling cycle, in which case the sampling positions may be determined in a similar way as what is illustrated by FIG. 5.

4. When the pattern position information includes the number of bytes per sampling interval, the number of bytes sampled between two adjacent sampling intervals and the sampling direction, the sampling positions may be determined as follows.

Figure 6:
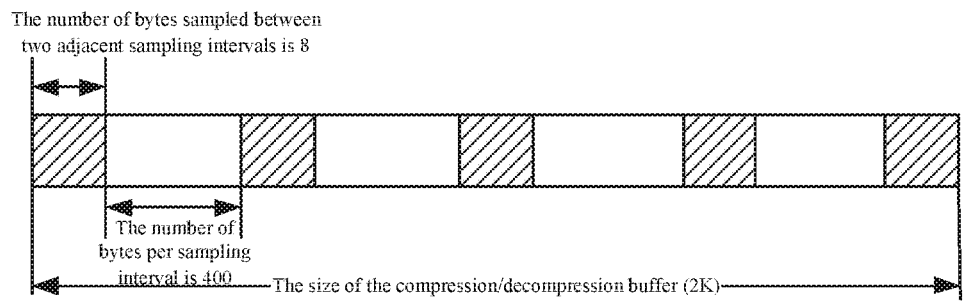
FIG. 6 is a schematic diagram of determining sampling positions according to the number of bytes per sampling interval, the number of bytes sampled between two adjacent sampling intervals and the sampling direction according to an embodiment of the disclosure.

As illustrated by FIG. 6, suppose that the size of the buffer is set to be 2 kilobytes (2048 bytes), the number of bytes per sampling interval is 400, the number of bytes sampled between two adjacent sampling intervals is 8 and the sampling direction is from the head to the tail of the buffer. Then sampling starts from the first byte of the buffer, the bytes [1, 8] in the buffer are determined as a sampling position, data of the bytes [9, 408] is determined as other data, the bytes [409, 416] are determined as another sampling position, and the data of the bytes [417, 816] is determined as other data. The process is repeated till the end of the buffer.

Accordingly, the sampling direction may be from the tail to the head of the buffer instead, in which case the sampling positions may be determined in a way similar to what is illustrated by FIG. 6.

Figure 7:
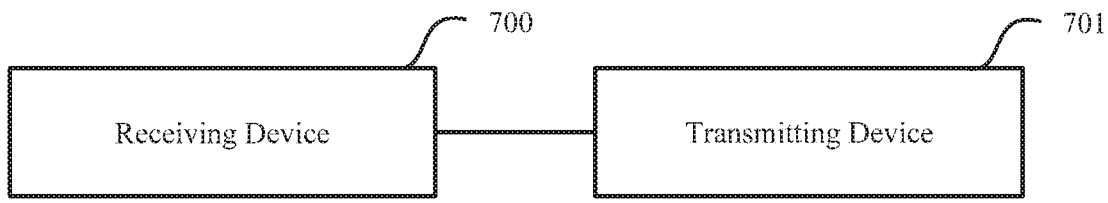
FIG. 7 is a schematic diagram of a structure of a system according to an embodiment of the disclosure.

As illustrated by FIG. 7, an embodiment of the disclosure provides a system for handling out-of-sync buffers. The system includes a receiving device 700 and a transmitting device 701.

The receiving device 700 is configured to: notify the transmitting device after determining that a compression buffer and a decompression buffer are out of sync; reset the decompression buffer after receiving a reset instruction from the transmitting device; and decompress a received UDC data packet with help of the reset decompression buffer.

The transmitting device 701 is configured to: reset the compression buffer and transmit the reset instruction to the receiving device after being notified by the receiving device that the compression buffer and the decompression buffer are out of sync; and transmit to the receiving device the UDC data packet compressed with help of the reset compression buffer.

The transmitting device may be a UE, and the receiving device may be a network side device.

According to the embodiment of the disclosure, after determining that the compression buffer and the decompression buffer are out of sync, the receiving device transmits the mismatch notification to the transmitting device; the transmitting device resets the compression buffer and sends the reset instruction to the receiving device; the receiving device resets the decompression buffer after receiving the reset instruction from the transmitting device; and the transmitting device and the receiving device perform subsequent data packet transmission with the help of reset compression and decompression buffers. In other words, if the compression and decompression buffers are determined to be out of sync, the receiving device shall send a mismatch notification to the transmitting device, the transmitting device would team about the checksum error, reset the compression buffer and instructing the receiving device to reset the decompression buffer. After the reset is done, the transmitting and receiving devices perform subsequent data packet transmission with the help of reset compression and decompression buffers. As such, not only the existing problem of checksum error is solved, the UDC function is taken full advantage of, air-interface resources are saved and transmission efficiency is improved.

When the receiving device detects the checksum error, it sends the mismatch notification to the transmitting device.

According to the embodiment of the disclosure, two methods for transmitting the notification by the receiving device may be used, including notifying the transmitting device by using radio resource control (hereinafter "RRC") signaling, and notifying the transmitting device by using a packet data convergence protocol (hereinafter "PDCP") control protocol data unit (hereinafter "PDU"), The two methods are introduced below in detail.

1. Notifying the transmitting device by using the RRC signaling.

When the receiving device detects the checksum error, the PDCP layer in the receiving device notifies the RRC layer of the checksum error.

Accordingly, the RRC layer notifies the UE that the compression and decompression buffers are out of sync via RRC signaling, where information such as data radio bearer identifications (hereinafter "DRB IDs") may be used in the RRC signaling to distinguish between different PDCP entities and to notify the UE of the PDCP entity which detects the checksum error.

In one embodiment, when the PDCP layer in the receiving device notifies the RRC layer of the checksum error, it also notifies the RRC layer of a sequence number (hereinafter "SN") of the PDCP entity where the checksum error is detected. The RRC layer puts the SN of the PDCP entity which detects the checksum error into the mismatch notification indicating that the compression and decompression buffers are out of sync to the transmitting device.

For example, when the receiving device detects a checksum error of a data packet having a PDU SN=50, then the PDCP layer of the receiving device notifies the RRC layer of the checksum error of the data packet having the PDU SN=50, and the RRC layer puts the PDU SN=50 into the mismatch notification indicating that the compression and decompression buffers are out of sync to the transmitting device.

2. Notifying the transmitting device by using the PDCP control PDU.

When the receiving device detects the checksum error, a PDCP entity in the receiving device may organize the mismatch notification indicating that the compression and decompression buffers are out of sync itself. E.g., it may use the PDCP control PDU as the mismatch notification.

In one embodiment, the PDCP entity in the receiving device may put the PDCP SN of the PDCP entity which detects the checksum error into the notification to be sent to the transmitting device.

In implementation, a format of the PDCP control PDU includes one or more of the following effective fields.

(1) DX field, configured to distinguish between data PDU and control PDU.

(2) PDU type field, having one or more values and indicating the UDC buffer checksum error.

(3) SN field, configured to indicate an SN of a data packet where a checksum error is detected. The length of the SN field may depend on the length of the SN used by a data PDU and e.g., the 12, 15 or 18 bits supported by LIE may be used as the length of the SN field.

The SN of the PDCP entity detecting the checksum error may be a PDCP SN indicating a first data packet from which the decompression starts to fail, or may be a PDCP SN indicating a subsequent packet, received by the receiving device after the first data packet, where a checksum error is detected.

For example, the receiving device detects a checksum error of the data packet with PDU SN=50, then the PDCP entity in the receiving device puts the PDU SN=50 into the PDCP control PDU to be sent to the transmitting device, so that the transmitting device is notified that the checksum error is detected at the data packet with PDU SN=50.

In one embodiment, when the receiving device notifies the transmitting device of the checksum error by sending the PDCP control PDU, the receiving device starts a timer such as a count-up timer. For example, the timer counts for 50 seconds from number 0 up to 50.

In one embodiment, the timer may also be a count-down timer. For example, the timer counts for 50 seconds from number 50 down to 0.

If the receiving device receives no reset instruction before the timer expires, it resends the mismatch notification to the transmitting device.

If the receiving device receives no reset instruction before the timer expires and the number of times that it sends the mismatch notification to the transmitting device has reached a preset maximum number, then it determines that the data transmission fails. After determining the failure, the error may also be reported to the RRC layer.

The duration of the timer and the maximum number of times for transmitting the mismatch notification may be set by a person skilled in the art according to practical needs or may be configured by a higher layer of the network side.

For example, suppose the timer is set to count for 50 seconds and the maximum number of times for transmitting the mismatch notification is 10. After the PDCP entity in the receiving device puts the PDU SN=50 into the PDCP control PDU and sends the PDCP control PDU to the transmitting device, the receiving device starts the timer. If the receiving device does not receive the reset instruction during the 50 seconds, it resends the mismatch notification to the transmitting device and restarts the timer. If the number of timers the transmitting device sends the mismatch notification reaches 10, then the receiving device determines that the data transmission fails and reports the error to the RRC layer.

Accordingly, the receiving device directly deletes the first data packet where the checksum error is detected and data packets received subsequently to the first data packet until it receives the reset instruction.

Accordingly, after receiving the mismatch notification, the transmitting device resets the compression buffer.

In one embodiment, the transmit device may reset the compression buffer by setting the compression buffer to all zeros, or by replacing all contents of the compression buffer by a part or all of contents of a compression dictionary, or by replacing all the contents of the compression buffer by preset initial values.

Several methods for resetting the compression buffer by the transmitting device according to the embodiment of the disclosure are described below in detail.

1. Resetting the compression buffer without a compression dictionary.

When a checksum error is detected, and the transmitting device and/or receiving device are not pre-configured with the compression dictionary, the transmitting device may reset the compression buffer by setting the compression buffer to all zeros or setting every byte of the compression buffer to an initial value.

For example, the transmitting device and/or receiving device are not pre-configured with the compression dictionary. When resetting the compression buffer, the transmitting device sets the compression buffer to all zeros (i.e. all zeros operation), or sets every byte of the compression buffer to the initial value such as 00110101.

2. Resetting the compression buffer with a compression dictionary.

(1) When a checksum error is detected, and the transmitting and receiving devices are pre-configured with the compression dictionary, the transmitting device may reset the compression buffer by setting the compression buffer to all zeros and then storing a part or all of the data of the compression dictionary into the compression buffer as the initial values of the compression buffer. Or, the transmitting device may reset the compression buffer by inserting a part of all of the data of the compression dictionary into the compression buffer from the tail in sequence without setting the compression buffer to all zeros. Then data in the head of the compression buffer would be pushed out of the compression buffer so that the part or all of the data of the compression dictionary replaces the data in the compression buffer.

The part or all of the data of the compression dictionary may also be put into the compression buffer starting from the head, then data in the tail of the compression buffer is to be pushed out.

In one embodiment, when the size of the compression dictionary and the size of compression buffer do not match, the initial contents of the compression and decompression buffers are made the same by using a pre-defined or pre-configured method.

For example, when the compression dictionary (001101001100) is larger than the compression buffer (11001010), the tail (01001100) of the compression dictionary is inserted into the compression buffer. When the compression dictionary (001101001100) is smaller than the compression buffer (1100101001011011), the compression dictionary is put into the tail of ilk the compression buffer and the rest of the compression buffer are set to 0s (i.e., 0000001101001100).

(2) When the transmitting and receiving devices are pre-configured with a plurality of compression dictionaries, the transmitting device decides to use one or more of the compression dictionaries according to configuration or by using another method. If a plurality of compression dictionaries are configured but no selected method is pre-defined, then the transmitting device may use a default dictionary.

For example, a plurality of compression dictionaries are pre-configured for different compression problems, such as a dedicated compression dictionary used for resetting the compression buffer. When reset processing is needed, a specific compression dictionary for reset processing is used for reset processing.

It is to be noted that, in the case that the transmitting and receiving devices are pre-configured with a compression dictionary, the transmitting device may set the middle of the compression buffer to initial values without using the compression dictionary. That's because the compression dictionary might only be useful for data packets in the beginning of a session rather than data packets in the middle of the session. As such, the reset of the middle of the compression buffer may be handled without a compression dictionary on the condition that the transmitting device and the receiving device reset their buffers in the same way.

Accordingly, after having reset the compression buffer, the transmitting device starts sending data packets to the receiving device again, and inserts a unique reset instruction into the head of the first PDU data packets sent after the reset. E.g., 1 bit in the head of the first UDC data packet sent after the reset represents the reset instruction, which is configured to indicate to the receiving device that the compression buffer has been reset for compressing data packets starting from this one and performs compression again by using the reset buffer. Other data packets sent after the first data packet do not need to carry the reset instruction and are handled according to normal compression and transmission process.

According to the embodiment of the disclosure, the transmitting device may send the reset instruction to the receiving device in different ways which are introduced below in detail.

1. The transmitting device starts compression from a first data packet to be sent after the reset to obtain a UDC data packet and sends the UDC data packet.

After having reset the compression buffer, the transmitting device transmits the first data PDU to be sent after the reset, where the head of the first data PDU to be sent after the rest carries the reset instruction, reset.

For example, after having sent the data with PDU SN=100, the transmitting device receives the mismatch notification from the receiving device. The transmitting device resets the compression buffer, and compresses data packets starting from the one with PDU SN=101 by using the reset compression buffer. The transmitting device inserts the reset instruction, reset, into the data packet with PDU SN=101 and sends the data packet to the receiving device. Data packets starting from the one with PDU SN=102 are compressed with the help of a new compression buffer, but do not need to carry the reset instruction, reset.

The transmitting device may start compression from the first data packet to be sent after the reset to obtain the UDC data packet and send the UDC data packet with the reset instruction in the following situations.

(1) If the receiving device does not insert a PDCP SN into the UDC buffer mismatch notification, then the transmitting device does not know from which data packet the decompression starts to fail and has to continue the transmission according to its own progress, which causes an SN gap or packet loss, at the receiving device. The packet loss may be recovered by a higher layer, e.g., through TCP retransmission, but cause long delay.

(2) If the receiving device inserts the PDCP SN into the UDC buffer mismatch notification, but because of its own reasons such as the algorithm of the transmitting device determines the retransmission as meaningless, the transmitting device fails to cache transmitted data packets, or the transmitting device has deleted data packets for which radio link control (hereinafter "RLC") acknowledge (hereinafter "ACK") messages have been received, the transmitting device may also continue to transmit data packets according to its own progress.

2. The transmitting device determines a data packet which is transmitted after the data packet corresponding to the PDCP SN inserted in the mismatch notification as a target data packet and sends the target data packet.

After having reset the compression buffer, the transmitting device needs to continue to send data packets. If the PDCP SN of the data packet where the checksum error is detected is received from the receiving device, the transmitting device may select some packets for retransmission according to storage of transmitted data. For example, the transmitting device may decide to send a data packet corresponding to the PDCP SN carried by the mismatch notification and a data packet corresponding to the next PDCP SN after the PDCP SN carried by the mismatch notification and the head of the first PDU sent after the reset of the compression buffer carries the reset instruction, reset.

For example, after having sent the data packet with PDU SN=100 and having learned that the PDCP SN of the data packet where the checksum error is detected is 100, the transmitting device resets the compression buffer and finds that copies of the transmitted data packets with PDU SNs ranging from 90 to 100 are saved, or that RLC layer ACL messages corresponding to all the data packets transmitted before the data packet with PDCP SN=89 (included) have been received, then the transmitting device starts to compress data packets by using the reset compression buffer from the data packet having PDCP SN=90 and inserts the reset instruction, reset, into the PDU data packet with PDCP SN=90. The transmitting device compresses data packets after the data packet with PDCP SN=91 by using a new compression buffer without inserting the reset instruction, reset.

In fact, if the mismatch notification received by the transmitting device includes the PDCP SN of the data packet where the checksum error is detected, usually after resetting the compression buffer, the transmitting device continues to transmit data packets from the data packet having the PDCP SN indicating the repeated checksum error to avoid SN gap.

In one embodiment, the transmitting device may start the data transmission after resetting the compression buffer from any data packet which it considers as appropriate and corresponds to an SN having a value between PDCP SN and Next PDCP SN, which may cause an SN gap.

The transmitting device may determine a data packet which is transmitted after the data packet corresponding to the PDCP SN inserted in the mismatch notification as the target data packet and sends the target data packet in the following situations.

(1) If the receiving device does not know from which data packet the decompression starts to fail, the transmitting device has to resend as many as possible transmitted data packets whose copies are saved, or speculate the first data packet where the decompression starts to fail (generally, if data packets are received by the receiving device in the same order as they were transmitted by the transmitting device, the buffers are usually in sync, and mismatch would only occur when an uncertain situation or an abnormal packet loss arises, so most or even all of transmitted data packets which the receiving device fails to receive or decompress may be resent to the receiving device if the transmitting device starts to resend data packets from the first one whose acknowledgement message has not been received). Yet the SN gap or packet loss may still occur at the receiving device, which may be handled by a higher layer, e.g., through TCP retransmission, causing a long delay.

(2) The receiving device know the PDCP SN of the data packet where the checksum error is detected, but because of its own reasons such as the algorithm of the transmitting device determines the retransmission as meaningless, the transmitting device fails to cache transmitted data packets, or the transmitting device has deleted data packets for which RLC ACK messages have been received, the transmitting device may also continue to send data packets from a data packet in the cache whose PDCP SN equals to or is greater than the PDCP SN of the data packet where the checksum error is detected.

3. The transmitting device determines a target data packet according to the PDCP SN inserted into the mismatch notification, starts compression using the reset compression buffer from the target data packet to obtain a UDC compression data packet and sends the data packet.

After having reset the compression buffer, the transmitting device starts to resend data packet(s). If the transmitting device has received the PDCP SN of the data packet where the checksum error is detected (i.e., the PDCP SN inserted into the mismatch notification), and copies of all transmitted data packets having a PDCP SN equal to or greater than the PDCP SN of the data packet where the checksum error is detected are saved by the transmitting device, then the transmitting device may starts the retransmission from the data packet having the PDCP SN inserted into the notification and puts the reset instruction, reset, into the head of the first PDU sent after the reset of the compression buffer. Other data packets subsequent to the first PDU are compressed and sent according to the normal process without carrying the reset instruction, reset.

For example, after having sent a data packet with PDU SN=100, the transmitting device receives a mismatch notification including a PDCP SN=80 from the receiving device. The transmitting device resets the compression buffer and finds that copies of transmitted data packets whose PDCP SN ranging from 80 to 100 are saved by itself. Then the transmitting device may start compression using the reset compression buffer from the data packet with PDCP SN=80 and inserts the reset instruction, reset, into the data packet with PDCP SN=80. The transmitting device compresses data packets whose PDCP SN is greater than or equal to 81 by using a new compression buffer without inserting the reset instruction, reset.

The transmitting device may determine the target data packet according to the PDCP SN inserted into the mismatch notification, start compression using the reset compression buffer from the target data packet to obtain the UDC compression data packet and send the data packet with the reset instruction in the following situations.

If the receiving device inserts a PDCP SN corresponding to a data packet where a checksum error is detected into the mismatch notification, the transmitting device may resend data packets from the one corresponding to the PDCP SN, and insert the reset instruction into the PDU corresponding to the PDCP SN to ensure that all data failing to be decompressed can be recovered by the receiving device, so that there's no gap in the receiving sequence, that is, no packet loss occurs. It will reduce block error rate and delay of the UDC service and improve user experience.

Accordingly, after having received the UDC data packet carrying the reset instruction, the receiving device may set the lower boundary of the receiving window according to the PDCP SN corresponding to the received data packet.

For example, the receiving device updates the lower boundary of the receiving window as the PDCP SN of the first data packet that carries the reset instruction.

It is to be noted that security operations such as encryption are performed for data transmission. Because the transmitting device performs the security operations on data packets, e.g., encrypts the data packets, after the data packets are compressed, if the compression buffer is changed or reset, even if the original data packets are the same, the data packet compressed using the original buffer and the data packet compressed using the reset buffer are different due to the difference of the buffer before and after the reset. Moreover, it is not reasonable to perform security operations such as encryption on two different data packets using the same security parameters from a secure point of view. As such, it is necessary to change the security parameters during retransmission of data to meet the basic security requirements.

When the transmitting device sends to the receiving device data packets compressed with the help of the reset compression buffer in the first way mentioned above, because no data packets are to be retransmitted, the transmitting device performs the security operations on the first data packet compressed using the reset compression buffer directly, where it is reasonable to use the same security parameters for the security operations such as encryption.

When the transmitting device sends to the receiving device data packets compressed with the help of the reset compression buffer in the second or third way mentioned above, since one or more data packets are to be retransmitted, each security parameter for the security operation must be updated before data retransmission to satisfy the requirement that the same group of security parameters cannot be used for two data packets.

The security parameters include some or all of the following parameters: a security key, a DRB ID, a PDCP SN, and a COUNT value.

When the parameter(s) to be changed is the security key and/or the DRB ID, the RRC layer may reconfigure the parameter(s), and notify the transmitting device.

When the parameter(s) to be changed includes the PDCP SN, the transmitting device updates the PDCP SN, and sends a UDC data packet to the receiving device by using the reset compression buffer according to the updated PDCP SN, where UDC data packets transmitted after the reset of the compression buffer are renumbered starting with the updated PDCP SN.

The updated PDCP SN is the Y-th unused PDCP SN after the PDCP SN of the data packet where the checksum error is detected. For example, Y may be 1.

For example, if the receiving device informs the transmitting device that decompression starts to fail from the data packet with PDCP SN=100, then if the transmitting device needs to resend data packets from the data packet with PDCP SN=100, the transmitting device shall use the next PDCP SN after the highest PDCP SN that has been used, instead of the original PDCP SN (i.e., SN=100), as the PDCP SN of the first retransmitted data packet. For example, suppose that the highest PDCP SN that has been used is 110, then the new PDCP SN carried by the retransmitted data packet originally corresponding to the PDCP SN=100 would be 111, the new PDCP SN carried by the retransmitted data packet originally corresponding to the PDCP SN=101 would be 112, the new PDCP SN carried by the retransmitted data packet originally corresponding to the PDCP SN=102 would be 113 and so on.

Accordingly, the receiving device resets the decompression buffer and decompresses the received UDC data packet using the reset decompression buffer.

The receiving device resets the decompression buffer in the same way as the transmitting device reset the compression buffer. It is to he noted that the methods for resetting the buffers by the transmitting and receiving devices are pre-configured and must be the same.

Figure 8:
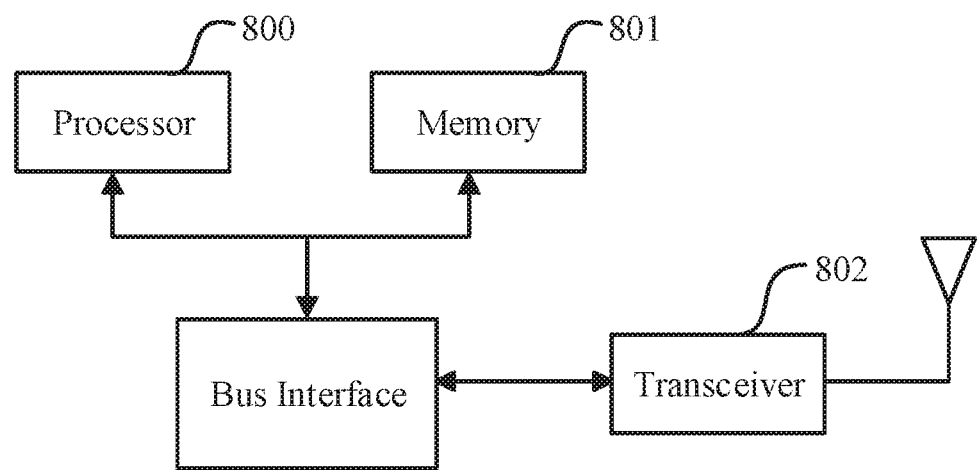
FIG. 8 is a schematic diagram of a structure of a receiving device according to an embodiment of the disclosure.

As illustrated by FIG. 8, the embodiment of the disclosure provides a receiving device for handling out-of-sync buffers. The receiving device includes a processor 800, a memory 801 and a transceiver 802.

The processor 800 is configured to read a program in the memory to: notify a transmitting device via the transceiver 802 after determining that a compression buffer and a decompression buffer are out of sync; reset the decompression buffer after receiving a reset instruction from the transmitting device via the transceiver 802; and decompress, with help of the reset decompression buffer, a UDC data packet received via the transceiver 802.

In one embodiment, the processor 800 is further configured to: insert a PDCP SN of a data packet where a checksum error is detected into a notification indicating that the compression buffer and the decompression buffer are out of sync, and transmit the notification to the transmitting device via the transceiver 802, after determining that the compression buffer and the decompression buffer are out of sync.

In one embodiment, the notification is RRC signaling or a PDCP

In one embodiment, when the notification is the PDCP control PDU, the processor 800 is further configured to: start a timer after determining that the compression buffer and the decompression buffer are out of sync and notifying the transmitting device via the transceiver 802, and re-notify the transmitting device via the transceiver 802 when the reset instruction is not received via the transceiver 802 before the timer expires.

In one embodiment, after starting the timer, the processor 800 is further configured to: determine that data transmission fails when the reset instruction is not received via the transceiver 802 before the timer expires and the number of times of re-notifying the transmitting device reaches a maximum number.

In one embodiment, the processor 800 is further configured to: set all of contents of the decompression buffer to zeros; or replace all of the contents of the decompression buffer by a part or all of contents of a compression dictionary; or replace all the contents of the decompression buffer by preset initial values.

In one embodiment, the processor 800 is further configured to: set a lower boundary of a receiving window according to an SN corresponding to a received UDC data packet carrying the reset instruction after receiving the reset instruction from the transmitting device via the transceiver 802 and resetting the decompression buffer.

In one embodiment, the processor 800 is further configured to: delete a UDC data packet where a checksum error is detected.

The processor 800 is responsible for managing the bus architecture and general processing. The memory 801 may store data used by the processor 800 when performing operations. The transceiver 802 is configured to receive and transmit data under the control of the processor 800.

The bus architecture may include any number of interconnected buses and bridges, linking together various circuits of one or more processors represented by the processor 800 and one or more memories represented by the memory 801. The bus architecture may also link various other circuits such as peripherals, voltage regulators, and power management circuits, which are well known in the art, so they are not described further herein. The bus interfaces provide interfaces. The processor 800 is responsible for managing the bus architecture and general processing, and the memory 801 may store data used by the processor 800 when performing operations.

The flows according to the embodiment of the disclosure may be applied to the processor 800 or implemented by the processor 800. In the implementation, each operation of the signal processing flow may be implemented by a hardware integrated logic circuit or a software instruction in the processor 800. The processor 800 may be a general-purpose processor, a digital signal processor, an application-specific integrated circuit, a field programmable gate array or other programmable logic device, a discrete gate or transistor logic device, or a discrete hardware component, which may implement or execute the methods, operations and logical block diagrams according to the embodiment of the disclosure. A general-purpose processor may be a microprocessor or any conventional processor. The operations of the method disclosed in combination with the embodiment of the disclosure may be directly implemented by a hardware processor, or may be performed by a combination of hardware and software modules in the processor. The software modules may be located in a storage medium such as a random access memory, a flash memory, a read-only memory, a programmable read-only memory, an electrically erasable programmable memory, or a register. The storage medium is located in the memory 801, and the processor 800 reads the information in the memory 801 and implements the operations of the signal processing flow in combination with its hardware.

Figure 9:
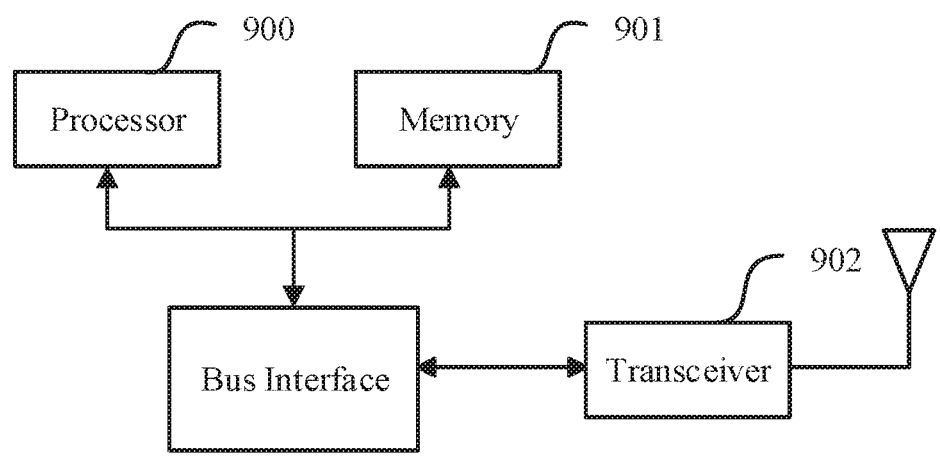
FIG. 9 is a schematic diagram of a structure of a transmitting device according to an embodiment of the disclosure.

As illustrated by FIG. 9, the embodiment of the disclosure further provides a transmitting device for handling out-of-sync buffers. The transmitting device includes a processor 900, a memory 901 and a transceiver 902.

The processor 900 is configured to read a program in the memory 901 to: reset a compression buffer and transmit a reset instruction to a receiving device via the transceiver 902 after being notified by the receiving device that the compression buffer and a decompression buffer are out of sync; and transmit to the receiving device via the transceiver 902 a UDC data packet compressed with help of the reset compression buffer.

In one embodiment, the processor 900 is further configured to: set all of contents of the decompression buffer to zeros; or replace all of the contents of the decompression buffer by a part or all of contents of a compression dictionary; or replace all the contents of the decompression buffer by preset initial values.

In one embodiment, the processor 900 is further configured to: start compression of data packets with the help of the reset compression buffer from a first data packet to be transmitted after the reset of the compression buffer to obtain the UDC data packet and transmit the UDC data packet to the receiving device via the transceiver 902; or determine a target data packet according to a PDCP SN indicating a checksum error and notified of by the receiving device, start compression of data packets with the help of the reset compression buffer from the target data packet to obtain the UDC data packet and transmit the UDC data packet to the receiving device via the transceiver 902.

In one embodiment, the processor 900 is further configured to: determine a data packet corresponding to the PDCP SN as the target data packet; or determine a data packet having transmitted after the data packet corresponding to the PDCP SN as the target data packet.

In one embodiment, the processor 900 is further configured to: update security parameters of the UDC data packet before transmitting to the receiving device via the transceiver 902 the UDC data packet compressed with the help of the reset compression buffer. The security parameters include a part or all of: a security key, a DRB ID, a PDCP SN and a. COUNT value.

In one embodiment, when the security parameter includes the PDCP SN, the processor 900 is further configured to: transmit via the transceiver 902 to the receiving device the UDC data packet compressed with the help of the reset compression buffer according to the updated PDCP SN.

In one embodiment, the UDC data packet is obtained by compressing the target data packet with the help of the reset compression buffer; and the updated PDCP SN is a Yth unused PDCP SN after the PDCP SN indicating the checksum error.

In one embodiment, when configured to transmit, via the transceiver 902, the reset instruction to the receiving device, the processor 900 is further configured to: insert the reset instruction into the first data packet to be transmitted after the reset of the compression buffer, when the processor is configured to start the compression of the data packets with the help of the reset compression buffer from the first data packet to be transmitted; or, insert the reset instruction into the target data packet when the processor is configured to start the compression of the data packets with the help of the reset compression buffer from the target data packet.

The processor 900 is responsible for managing the bus architecture and general processing. The memory 901 may store data used by the processor 900 when performing operations. The transceiver 902 is configured to receive and transmit data under the control of the processor 900.

The bus architecture may include any number of interconnected buses and bridges, linking together various circuits of one or more processors represented by the processor 900 and one or more memories represented by the memory 901. The bus architecture may also link various other circuits such as peripherals, voltage regulators, and power management circuits, which are well known in the art, so they are not described further herein. The bus interfaces provide interfaces. The processor 900 is responsible for managing the bus architecture and general processing, and the memory 901 may store data used by the processor 900 when performing operations.

The flows according to the embodiment of the disclosure may be applied to the processor 900 or implemented by the processor 900. In the implementation, each operation of the signal processing flow may be implemented by a hardware integrated logic circuit or a software instruction in the processor 900. The processor 900 may be a general-purpose processor, a digital signal processor, an application-specific integrated circuit, a field programmable gate array or other programmable logic device, a discrete gate or transistor logic device, or a discrete hardware component, which may implement or execute the methods, operations and logical block diagrams according to the embodiment of the disclosure. A general-purpose processor may be a microprocessor or any conventional processor. The operations of the method disclosed in combination with the embodiment of the disclosure may be directly implemented by a hardware processor, or may be performed by a combination of hardware and software modules in the processor. The software modules may be located in a storage medium such as a random access memory, a flash memory, a read-only memory, a programmable read-only memory, an electrically erasable programmable memory, or a register. The storage medium is located in the memory 901, and the processor 900 reads the information in the memory 901 and implements the operations of the signal processing flow in combination with its hardware.

Figure 10:
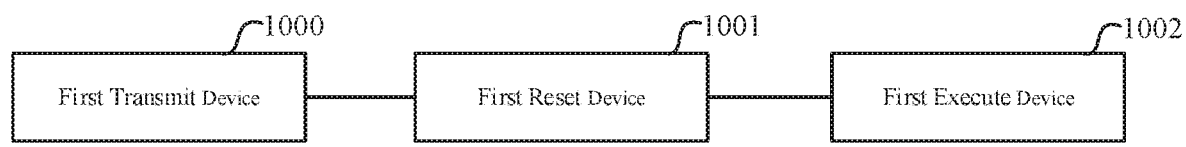
FIG. 10 is a schematic diagram of a structure of another receiving device according to an embodiment of the disclosure.

As illustrated by FIG. 10, the embodiment of the disclosure further provides a receiving device for handling out-of-sync buffers. The receiving device includes a first transmit device 1000, a first reset device 1001, and a first execute device 1002. The first transmit device 1000 is configured to notify a transmitting device after determining that a compression buffer and a decompression buffer are out of sync. The first reset device 1001 is configured to reset the decompression buffer after receiving a reset instruction from the transmitting device. The first execute device 1002 is configured to decompress a received UDC data packet with help of the reset decompression buffer.

In one embodiment, the first transmit device 1000 is further configured to: insert a PDCP SN of a data packet where a checksum error is detected into a notification indicating that the compression buffer and the decompression buffer are out of sync, and transmit the notification to the transmitting device, after determining that the compression buffer and the decompression buffer are out of sync.

In one embodiment, the notification is RRC signaling or a PDCP PDU.

In one embodiment, when the notification is the PDCP control PDU, the first transmit device 1000 is further configured to: start a timer after determining that the compression buffer and the decompression buffer are out of sync and notifying the transmitting device, and re-notify the transmitting device when the reset instruction is not received before the timer expires.

In one embodiment, after starting the timer, the first transmit device 1000 is further configured to: determine that data transmission fails when the reset instruction is not received before the timer expires and the number of times of notifying the transmitting device reaches a maximum number.

In one embodiment, the first reset device 1001 is further configured to: set all of contents of the decompression buffer to zeros; or replace all of the contents of the decompression buffer by a part or all of contents of a compression dictionary; or replace all the contents of the decompression buffer by preset initial values.

In one embodiment, the first execute device 1002 is further configured to: set a lower boundary of a receiving window according to an SN corresponding to a received UDC data packet carrying the reset instruction after receiving the reset instruction from the transmitting device and resetting the decompression buffer.

In one embodiment, the first execute device 1002 is further configured to: delete a UDC data packet where a checksum error is detected.

Figure 11:
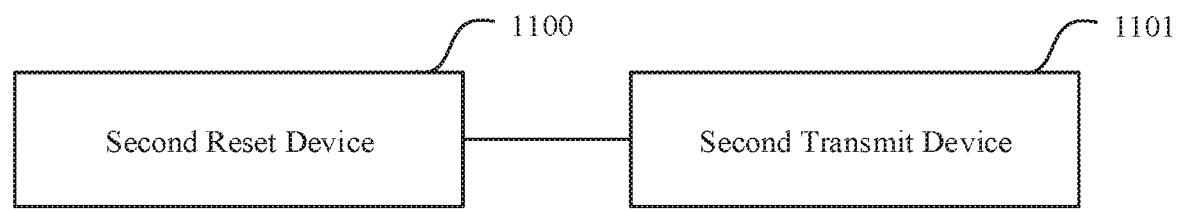
FIG. 11 is a schematic diagram of a structure of another transmitting device according to an embodiment of the disclosure.

As illustrated by FIG. 11, the embodiment of the disclosure provides a transmitting device for handling out-of-sync buffers. The transmitting device includes a second reset device 1100 and a second transmit device 1101. The second reset device 1100 is configured to reset a compression buffer and transmit a reset instruction to a receiving device after being notified by the receiving device that the compression buffer and a decompression buffer are out of sync. The second transmit device 1101 configured to transmit the receiving device a UDC data packet compressed with help of the reset compression buffer.

In one embodiment, the second reset device 1100 is further configured to: set all of contents of the decompression buffer to zeros; or replace all of the contents of the decompression buffer by a part or all of contents of a compression dictionary; or replace all the contents of the decompression buffer by preset initial values.

In one embodiment, the second transmit device 1101 is further configured to: start compression of data packets with the help of the reset compression buffer from a first data packet to be transmitted after the reset of the compression buffer to obtain the UDC data packet and transmit the UDC data packet to the receiving device; or determine a target data packet according to a PDCP SN indicating a checksum error and notified of by the receiving device, start compression of data packets with the help of the reset compression buffer from the target data packet to obtain the UDC data packet and transmit the UDC data packet to the receiving device.

In one embodiment, the second reset device 1101 is further configured to: determine a data packet corresponding to the PDCP SN as the target data packet; or determine a data packet having transmitted after the data packet corresponding to the PDCP SN as the target data packet.

In one embodiment, the second transmit device 1101 is further configured to: update security parameters of the UDC data packet before transmitting to the receiving device the UDC data packet compressed with the help of the reset compression buffer. The security parameters include a part or all of: a security key, a DRB ID, a PDCP SN and a COUNT value.

In one embodiment, when the security parameter includes the PDCP SN, the second transmit device 1101 is further configured to: transmit to the receiving device the UDC data packet compressed with the help of the reset compression buffer according to the updated PDCP SN.

In one embodiment, the UDC data packet is obtained by compressing the target data packet with the help of the reset compression buffer; and the updated PDCP SN is a Yth unused PDCP SN after the PDCP SN indicating the checksum error.

In one embodiment, when configured to transmit the reset instruction to the receiving device, the second transmit device 1101 is further configured to: insert the reset instruction into the first data packet to be transmitted after the reset of the compression buffer, when the processor is configured to start the compression of the data packets with the help of the reset compression buffer from the first data packet to be transmitted; or, insert the reset instruction into the target data packet when the processor is configured to start the compression of the data packets with the help of the reset compression buffer from the target data packet.

The embodiment of the disclosure further provides storage medium readable to a device for handling out-of-sync buffers. The storage medium includes program codes. When the program codes are run by a computing device, the computing device performs the method performed by the receiving device or performed by the transmitting device.

Notifying, by a receiving device, a transmitting device after determining that a compression buffer and a decompression buffer are out of sync; resetting, by the receiving device, the decompression buffer after receiving a reset instruction from the transmitting device; and decompressing, by the receiving device, a received UDC data packet with help of the reset decompression buffer.

Figure 12:
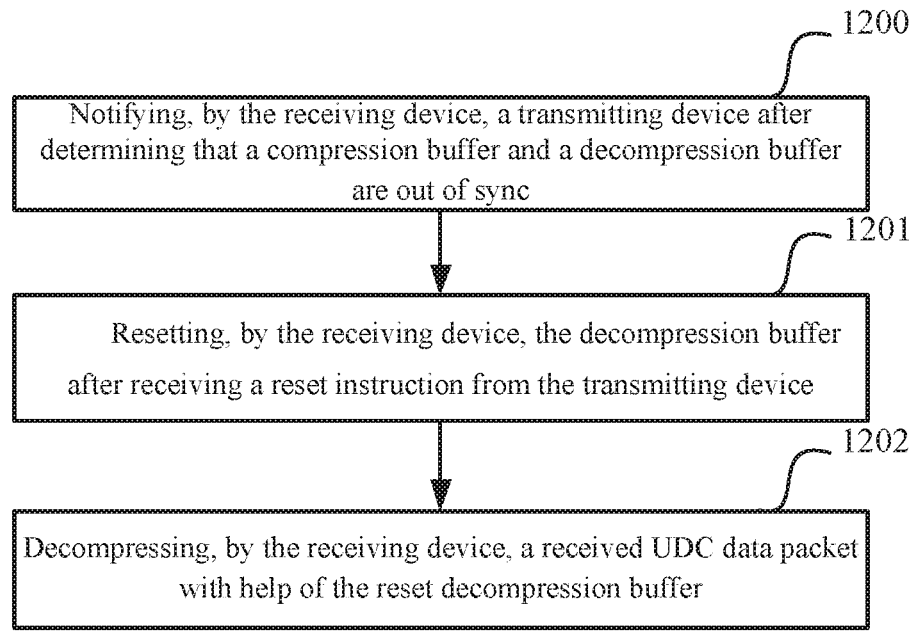
FIG. 12 is a flow chart of a method performed by a receiving device according to an ilk embodiment of the disclosure.

FIG. 12 illustrates a complete method for handling out-of-sync buffers performed by a receiver device according to the embodiment of the disclosure. The method includes operations 1200-1202.

Operation 1200: notifying, by the receiving device, a transmitting device after determining that a compression buffer and a decompression buffer are out of sync.

Operation 1201: resetting, by the receiving device, the decompression buffer after receiving a reset instruction from the transmitting device.

Operation 1202: decompressing, by the receiving device, a received UDC data packet with help of the reset decompression buffer.

In one embodiment, notifying, by the receiving device, the transmitting device after determining that the compression buffer and the decompression buffer are out of sync includes: inserting, by the transmitting device, a PDCP SN of a data packet where a checksum error is detected into a notification indicating that the compression buffer and the decompression buffer are out of sync, and transmitting the notification to the transmitting device, after determining that the compression buffer and the decompression buffer are out of sync.

In one embodiment, the notification is RRC signaling or a PDCP PDU.

In one embodiment, the notification is the PDCP control PDU. After determining that the compression buffer and the decompression buffer are out of sync and notifying the transmitting device, the method further includes: starting, by the receiving device, a timer; and re-notifying, by the receiving device, the transmitting device when the reset instruction is not ilk received before the timer expires.

In one embodiment, after starting, by the receiving device, the timer, the method further includes: determining, by the receiving device, that data transmission fails when the reset instruction is not received before the timer expires and the number of times that the receiving device notifies the transmitting device reaches a maximum number.

In one embodiment, resetting, by the receiving device, the decompression buffer after receiving the reset instruction from the transmitting device includes: setting, by the receiving device, all of contents of the decompression buffer to zeros; or replacing, by the receiving device, all of the contents of the decompression buffer by a part or all of contents of a compression dictionary; or replacing, by the receiving device, all the contents of the decompression buffer by preset initial values.

In one embodiment, after receiving, by the receiving device, the reset instruction from the transmitting device and resetting the decompression buffer, the method further includes: setting, by the receiving device, a lower boundary of a receiving window according to an SN corresponding to a received UDC data packet carrying the reset instruction.

In one embodiment, the method further includes: deleting, by the receiving device, a UDC data packet where a checksum error is detected.

Figure 13:
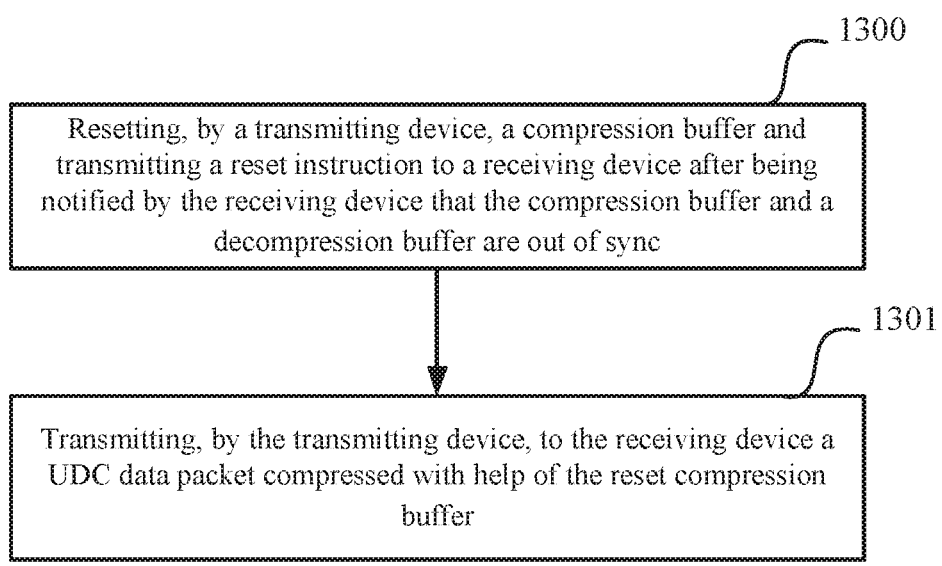
FIG. 13 is a flow chart of a method performed by a transmitting device according to an embodiment of the disclosure.

FIG. 13 illustrates a complete method for handling out-of-sync buffers performed by a transmit device according to the embodiment of the disclosure. The method includes operations 1300-1301.

Operation 1300: resetting, by a transmitting device, a compression buffer and transmitting a reset instruction to a receiving device after being notified by the receiving device that the compression buffer and a decompression buffer are out of sync.

Operation 1301: transmitting, by the transmitting device, to the receiving device a UDC data packet compressed with help of the reset compression buffer.

In one embodiment, resetting, by the transmitting device, the compression buffer includes: setting, by the transmitting device, all of contents of the decompression buffer to zeros; or replacing, by the transmitting device, all of the contents of the decompression buffer by a part or all of contents of a compression dictionary; or replacing, by the transmitting device, all the contents of the decompression buffer by preset initial values.

In one embodiment, transmitting, by the transmitting device, to the receiving device the UDC data packet compressed with the help of the reset compression buffer includes: starting, by the transmitting device, compression of data packets with the help of the reset compression buffer from a first data packet to be transmitted after the reset of the compression buffer to obtain the UDC data packet and transmit the UDC data packet to the receiving device; or determining, by the transmitting device, a target data packet according to a PDCP SN indicating a checksum error and notified of by the receiving device, starting compression of data packets with the help of the reset compression buffer from the target data packet to obtain the UDC data packet and transmit the UDC data packet to the receiving device.

In one embodiment, determining, by the transmitting device, the target data packet according to the PDCP SN indicating the checksum error and notified of by the receiving device includes: determining, by the transmitting device, a data packet corresponding to the PDCP SN as the target data packet; or determining, by the transmitting device, a data packet having transmitted after the data packet corresponding to the PDCP SN as the target data packet.

In one embodiment, before transmitting, by the transmitting device, to the receiving device the UDC data packet compressed with the help of the reset compression buffer, the method further includes: updating, by the transmitting device, security parameters of the UDC data packet; where the security parameters include a part or all of: a security key, a DRB ID, a PDCP SN and a COUNT value.

In one embodiment, the security parameters include the PDCP SN. Transmitting, by the transmitting device, to the receiving device the UDC data packet compressed with the help of the reset compression buffer includes: transmitting, by the transmitting device, to the receiving device the UDC data packet compressed with the help of the reset compression buffer according to the updated. PDCP SN.

In one embodiment, the UDC data packet is obtained by compressing the target data packet with the help of the reset compression buffer; and the updated PDCP SN is a Yth unused PDCP SN after the PDCP SN indicating the checksum error.

In one embodiment, transmitting, by the transmitting device, the reset instruction to the receiving device includes: inserting, by the transmitting device, the reset instruction into the first data packet to be transmitted after the reset of the compression buffer, when the transmitting device starts the compression of the data packets with the help of the reset compression buffer from the first data packet to be transmitted; or, inserting, by the transmitting device, the reset instruction into the target data packet when the transmitting device starts the compression of the data packets with the help of the reset compression buffer from the target data packet.

Figure 14:
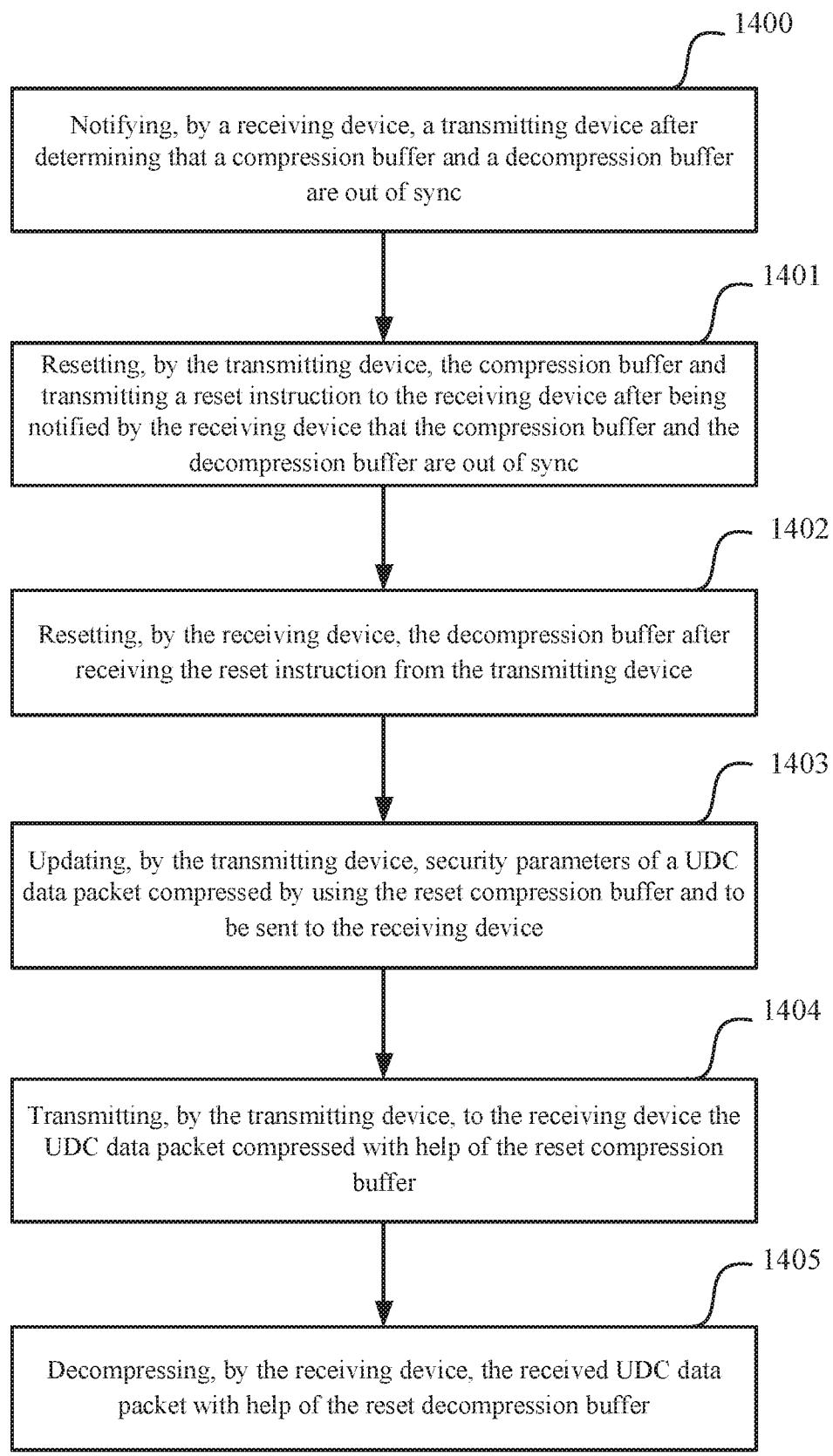
FIG. 14 is a flow chart of a complete method according to an embodiment of the disclosure.

FIG. 14 illustrates a complete method for handling out-of-sync buffers according to the embodiment of the disclosure. The method includes operations 1400-1405.

Operation 1400: notifying, by a receiving device, a transmitting device after determining that a compression buffer and a decompression buffer are out of sync.

Operation 1401: resetting, by the transmitting device, the compression buffer and ilk transmitting a reset instruction to the receiving device after being notified by the receiving device that the compression buffer and the decompression buffer are out of sync.

Operation 1402: resetting, by the receiving device, the decompression buffer after receiving the reset instruction from the transmitting device.

Operation 1403: updating, by the transmitting device, security parameters of a UDC data packet compressed by using the reset compression buffer and to be sent to the receiving device.

Operation 1404: transmitting, by the transmitting device, to the receiving device the UDC data packet compressed with help of the reset compression buffer.

Operation 1405: decompressing, by the receiving device, the received UDC data packet with help of the reset decompression buffer.

The methods, the devices (system) and the computer program product according to the embodiment of the disclosure have been described with reference to flow charts and/or block diagrams. It shall be appreciated that blocks of the flow charts and/or block diagrams, and/or, combinations of blocks of the flow charts and/or block diagrams may be implemented by computer program instructions. These computer program instructions can be loaded onto a general-purpose computer, a specific-purpose computer, an embedded processor or a processor of another programmable data processing apparatus to produce a machine so that the instructions executed by the processor of the computer or the other programmable data processing apparatus create means for performing the functions specified in the flows of the flow charts and/or the blocks of the block diagrams.

Accordingly, the embodiment of the disclosure may also be implemented by hardware and/or software (including firmware, resident software, microcode, etc.). Moreover, the embodiment of the disclosure may be implemented in the form of a computer program product on a computer-usable or computer-readable storage medium having computer-usable or computer-readable program codes implemented in the medium for use by an instruction execution system or in conjunction with the instruction execution system. Herein a computer-usable or computer-readable medium may be any medium that can contain, store, communicate, transmit, or transfer a program for use by or in connection with an instruction execution system, apparatus, or device.

The invention claimed is:

1. A method for handling out-of-sync buffers, comprising:
   notifying, by a receiving device, a transmitting device after determining that a compression buffer and a decompression buffer are out of sync;
   resetting, by the receiving device, the decompression buffer after receiving a reset instruction from the transmitting device; and
   decompressing, by the receiving device, a received uplink data compression (UDC) data packet with help of the reset decompression buffer, wherein notifying, by the receiving device, the transmitting device after determining that the compression buffer and the decompression buffer are out of sync comprises:
   after determining that the compression buffer and the decompression buffer are out of sync, inserting, by the receiving device, a packet data convergence protocol (PDCP) sequence number (SN) of a data packet where a checksum error is detected into a notification indicating that the compression buffer and the decompression buffer are out of sync, and transmitting the notification to the transmitting device.

2. The method according to claim 1, wherein the notification is radio resource control (RRC) signaling or a PDCP control protocol data unit (PDU).

3. The method according to claim 2, wherein the notification is the PDCP control PDU; and
   after determining that the compression buffer and the decompression buffer are out of sync and notifying the transmitting device, the method further comprises:
   starting, by the receiving device, a timer; and
   re-notifying, by the receiving device, the transmitting device when the reset instruction is not received before the timer expires.

4. The method according to claim 3, after starting, by the receiving device, the timer, further comprising:
   determining, by the receiving device, that data transmission fails when the reset instruction is not received before the timer expires and the number of times that the receiving device re-notifies the transmitting device reaches a maximum number.

5. The method according to claim 1, wherein resetting, by the receiving device, the decompression buffer after receiving the reset instruction from the transmitting device comprises:
   setting, by the receiving device, all of contents of the decompression buffer to zeros; or
   replacing, by the receiving device, all of the contents of the decompression buffer by a part or all of contents of a compression dictionary; or
   replacing, by the receiving device, all the contents of the decompression buffer by preset initial values.

6. The method according to claim 1, after receiving, by the receiving device, the reset instruction from the transmitting device and resetting the decompression buffer, further comprising:

setting, by the receiving device, a lower boundary of a receiving window according to an SN corresponding to a received UDC data packet carrying the reset instruction.

7. The method according to claim 1, further comprising: deleting, by the receiving device, a UDC data packet where a checksum error is detected.

8. A non-transitory storage medium readable to a device for handling out-of-sync buffers, comprising program codes, wherein when the program codes are run by a computing device, the computing device performs the method according to claim 1.

9. A method for handling out-of-sync buffers, comprising:
resetting, by a transmitting device, a compression buffer and transmitting a reset instruction to a receiving device after being notified by the receiving device that the compression buffer and a decompression buffer are out of sync; and
transmitting, by the transmitting device, to the receiving device an uplink data compression (UDC) data packet compressed with help of the reset compression buffer, wherein notifying, by the receiving device, the transmitting device after determining that the compression buffer and the decompression buffer are out of sync comprises:
after determining that the compression buffer and the decompression buffer are out of sync, inserting, by the receiving device, a packet data convergence protocol (PDCP) sequence number (SN) of a data packet where a checksum error is detected into a notification indicating that the compression buffer and the decompression buffer are out of sync, and transmitting the notification to the transmitting device.

10. The method according to claim 9, wherein resetting, by the transmitting device, the compression buffer comprises:
setting, by the transmitting device, all of contents of the decompression buffer to zeros; or
replacing, by the transmitting device, all of the contents of the decompression buffer by a part or all of contents of a compression dictionary; or
replacing, by the transmitting device, all the contents of the decompression buffer by preset initial values.

11. The method according to claim 9, wherein transmitting, by the transmitting device, to the receiving device the UDC data packet compressed with the help of the reset compression buffer comprises:
starting, by the transmitting device, compression of data packets with the help of the reset compression buffer from a first data packet to be transmitted after the reset of the compression buffer to obtain the UDC data packet and transmit the UDC data packet to the receiving device; or
determining, by the transmitting device, a target data packet according to a packet data convergence protocol (PDCP) sequence number (SN) indicating a checksum error and notified of by the receiving device, starting compression of data packets with the help of the reset compression buffer from the target data packet to obtain the UDC data packet and transmit the UDC data packet to the receiving device.

12. The method according to claim 11, wherein determining, by the transmitting device, the target data packet according to the PDCP SN indicating the checksum error and notified of by the receiving device comprises:

determining, by the transmitting device, a data packet corresponding to the PDCP SN as the target data packet; or
determining, by the transmitting device, a data packet having transmitted after the data packet corresponding to the PDCP SN as the target data packet.

13. The method according to claim 12, before transmitting, by the transmitting device, to the receiving device the UDC data packet compressed with the help of the reset compression buffer, further comprising:
updating, by the transmitting device, security parameters of the UDC data packet; wherein the security parameters include a part or all of: a security key, a data radio bearer identification (DRB ID), a PDCP SN and a COUNT value.

14. The method according to claim 13, wherein the security parameters comprise the PDCP SN; and
transmitting, by the transmitting device, to the receiving device the UDC data packet compressed with the help of the reset compression buffer comprises:
transmitting, by the transmitting device, to the receiving device the UDC data packet compressed with the help of the reset compression buffer according to the updated PDCP SN.

15. The method according to claim 14, wherein the UDC data packet is obtained by compressing the target data packet with the help of the reset compression buffer; and
the updated PDCP SN is a Yth unused PDCP SN after the PDCP SN indicating the checksum error.

16. The method according to claim 12, wherein transmitting, by the transmitting device, the reset instruction to the receiving device comprises:
inserting, by the transmitting device, the reset instruction into the first data packet to be transmitted after the reset of the compression buffer, when the transmitting device starts the compression of the data packets with the help of the reset compression buffer from the first data packet to be transmitted; or,
inserting, by the transmitting device, the reset instruction into the target data packet when the transmitting device starts the compression of the data packets with the help of the reset compression buffer from the target data packet.

17. A transmitting device for handling out-of-sync buffers, comprising a processor, a memory and a transceiver; wherein the processor is configured to read a program in the memory to perform the method according to claim 9.

18. A non-transitory storage medium readable to a device for handling out-of-sync buffers, comprising program codes, wherein when the program codes are run by a computing device, the computing device performs the method according to claim 9.

19. A receiving device for handling out-of-sync buffers, comprising a processor, a memory and a transceiver; wherein the processor is configured to read a program in the memory to:
notify a transmitting device via the transceiver after determining that a compression buffer and a decompression buffer are out of sync; reset the decompression buffer after receiving a reset instruction via the transceiver from the transmitting device; and decompress, with help of the reset decompression buffer, a UDC data packet received via the transceiver, wherein notifying, by the receiving device, the transmitting device after determining that the compression buffer and the decompression buffer are out of sync comprises:

after determining that the compression buffer and the decompression buffer are out of sync, inserting, by the receiving device, a packet data convergence protocol (PDCP) sequence number (SN) of a data packet where a checksum error is detected into a notification indicating that the compression buffer and the decompression buffer are out of sync, and transmitting the notification to the transmitting device.

* * * * *